US006939782B2

(12) United States Patent
Aspar et al.

(10) Patent No.: US 6,939,782 B2
(45) Date of Patent: Sep. 6, 2005

(54) METHOD FOR PRODUCING THIN LAYERS ON A SPECIFIC SUPPORT AND AN APPLICATION THEREOF

(75) Inventors: Bernard Aspar, Rives (FR); Jean-Frédéric Clerc, Le Fontanil Cornillon (FR)

(73) Assignee: Commissariat a l'Energie Atomique (FR)

( * ) Notice: Subject to any disclaimer, the term of this patent is extended or adjusted under 35 U.S.C. 154(b) by 46 days.

(21) Appl. No.: 10/469,633

(22) PCT Filed: Mar. 1, 2002

(86) PCT No.: PCT/FR02/00754

§ 371 (c)(1), (2), (4) Date: Jan. 20, 2004

(87) PCT Pub. No.: WO02/071475

PCT Pub. Date: Sep. 12, 2002

(65) Prior Publication Data

US 2004/0110320 A1 Jun. 10, 2004

(30) Foreign Application Priority Data

Mar. 2, 2001 (FR) .............................. 01 02890

(51) Int. Cl.⁷ .............................. H01L 21/30
(52) U.S. Cl. ...................... 438/455; 438/458; 438/459; 438/960
(58) Field of Search .......................... 438/455, 458–459, 438/960

(56) References Cited

U.S. PATENT DOCUMENTS

| 5,300,788 | A | | 4/1994 | Fan et al. | |
|---|---|---|---|---|---|
| 6,020,252 | A | * | 2/2000 | Aspar et al. | ................. 438/458 |
| 6,127,199 | A | * | 10/2000 | Inoue et al. | .................. 438/30 |
| 6,271,101 | B1 | * | 8/2001 | Fukunaga | ................... 438/455 |
| 6,534,380 | B1 | * | 3/2003 | Yamauchi et al. | ........... 438/455 |

FOREIGN PATENT DOCUMENTS

| EP | 0 767 486 A2 | 4/1997 |
|---|---|---|
| EP | 0 786 801 A1 | 7/1997 |
| EP | 1 014 452 A1 | 6/2002 |
| JP | 11-233449 | 8/1999 |
| WO | WO 01/11930 A2 | 2/2001 |

* cited by examiner

Primary Examiner—Luan Thai
(74) Attorney, Agent, or Firm—Brinks Hofer Gilson & Lione

(57) ABSTRACT

The invention relates to a method for producing a thin layer (8) containing at least one component (6, 6A, 6B) comprising:—a preparation step, wherein an added layer (2, 3, 4) is created on a support (1), at least one part (2) of said layer being adapted for local embrittling and said substrate and the part which can be embrittled being made from different materials and/or having different microstructures; an embrittlement step, wherein a fragile underlayer (5) is produced in the part which can be embrittled; a work step, wherein at least one component (6, 6A, 6B) is created on said added layer; and a separation step, wherein a dissociation is induced in the part which can be embrittled, along said fragile underlayer, in order to produce a thin layer (8) comprising a part of said added layer and said component.

38 Claims, 6 Drawing Sheets

Figure 5:
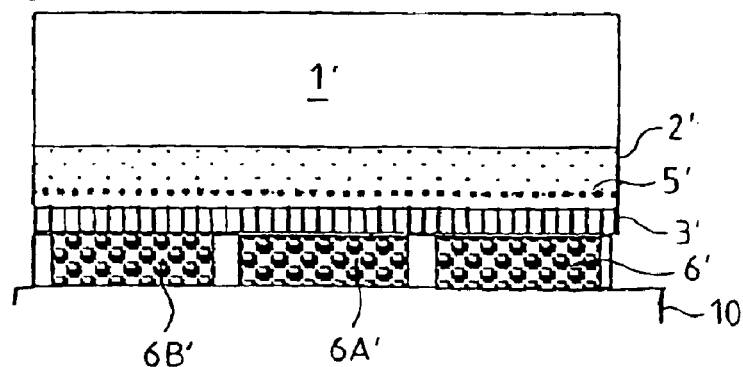

Fig. 1
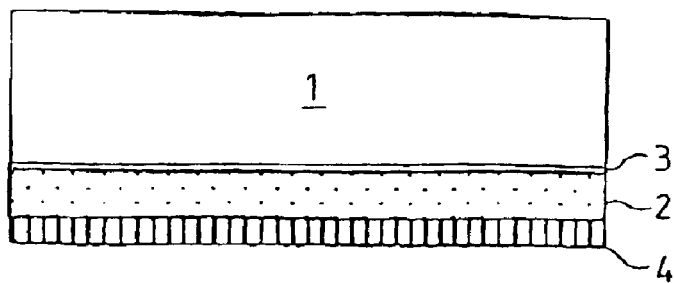
Fig. 2
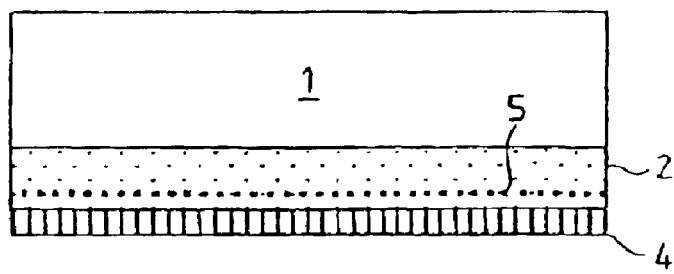
Fig. 3
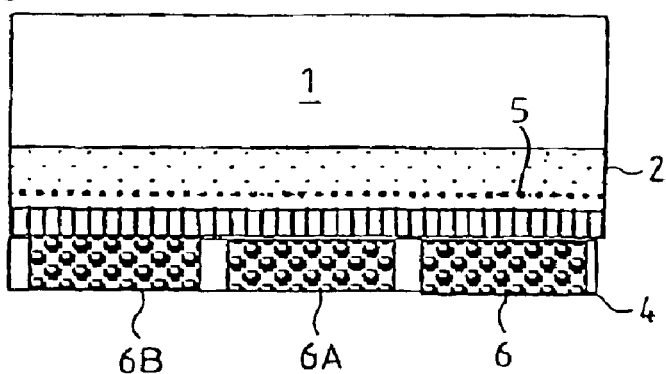
Fig. 4
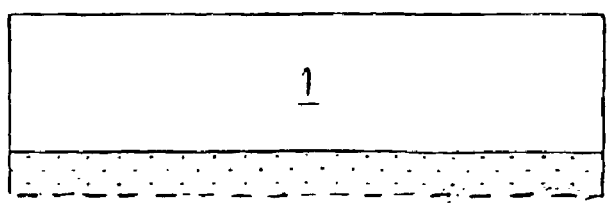
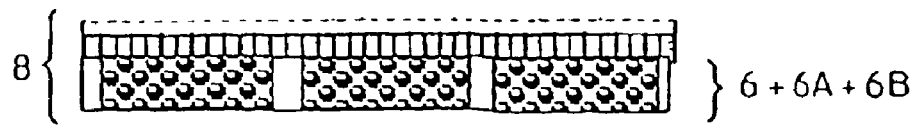

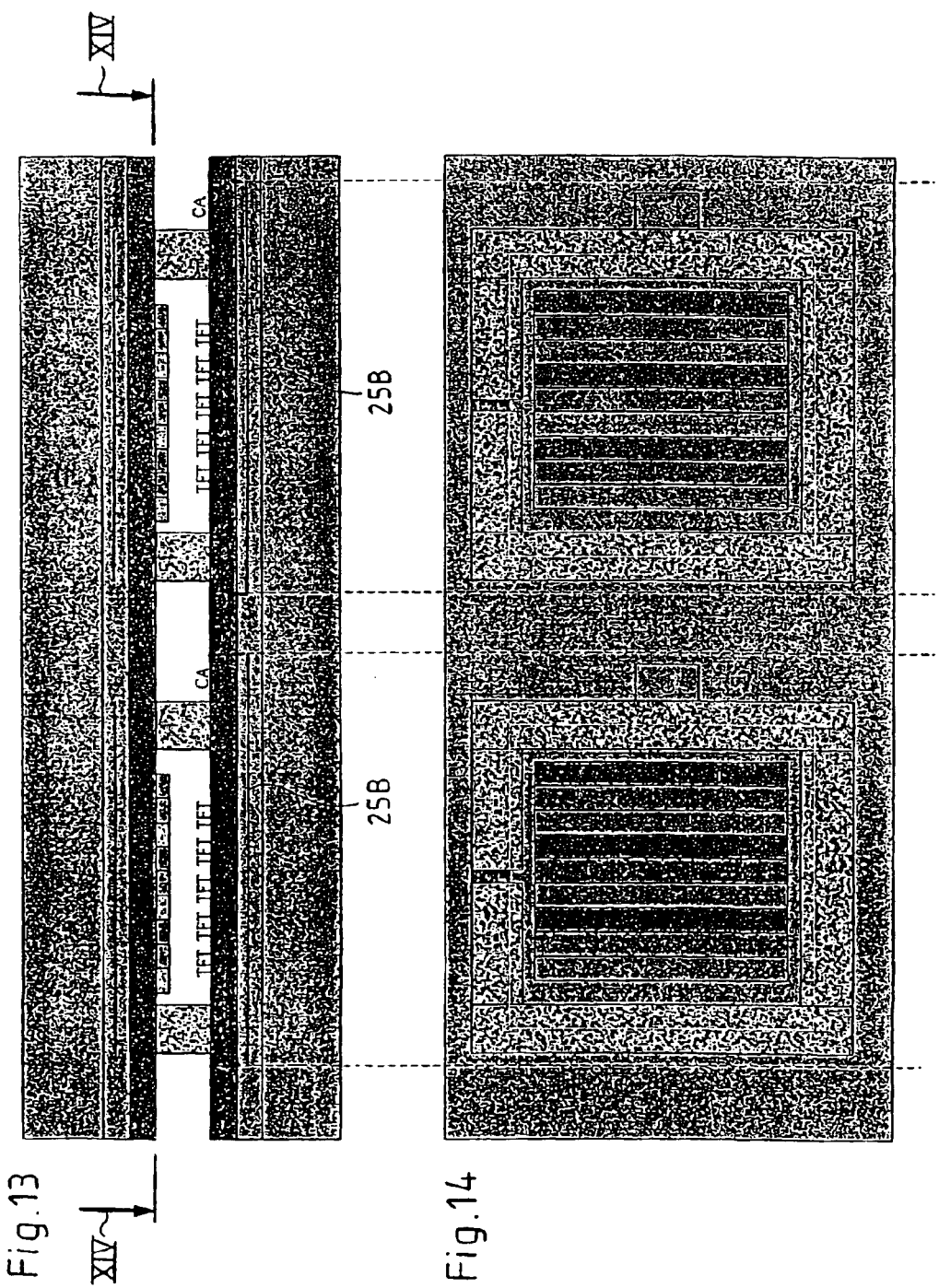

METHOD FOR PRODUCING THIN LAYERS ON A SPECIFIC SUPPORT AND AN APPLICATION THEREOF

This application claims priority to French Patent Application No. 0102890 filed Mar. 2, 2001.

FIELD

Future portable systems (for example mobile telephones, chip cards or personal organizers of the future) will integrate an increasing number of functions. These systems, for example personal organizers of the future, will use a number of technological <<modules>>. These technological modules include: screens, operating system, microprocessor, batteries. Of these components, the screens are the ones which occupy the greater part of the surface area and their integration in the system is an important aspect.

These objects will not be developed on a mass scale unless the cost of these components comes down. For this to happen, it is necessary to find technologies that are compatible with high volumes, enabling these components to be made on substrates of large dimensions, such as glass for example. However, although this substrate is not expensive, it has a major drawback, namely its resistance to shock. Components or devices made on these substrates necessarily require the use of additional protective measures if they are to be integrated in portable systems.

To integrate these components in the most efficient way possible, it would be practical if these components could be integrated on the final substrate. In many situations, it may be of advantage to use plastic for this substrate. One of the challenges this presents, for example, is to make screens on a plastic substrate, combining the advantages of low cost, low weight and high resistance to shock (at least compared with glass). This application is of particular interest in the case of new generation mobile telephones.

In mobile systems, such as chip cards for example, it is also necessary to have components of a slim thickness (to adapt to that of the chip card), in order to deal with the problems of weight and flexibility.

Problem to be Solved

Making these components on a substrate such as plastic is a delicate matter. In practice, it is necessary either to modify the entire technology used to make these components, rendering it compatible with the use of conventional plastic, or to find special <<plastic>> substrates that are compatible with the heat treatments used with the technology (it is clear, in particular, that it will be necessary to work below the softening point of these substrates).

Another approach is to make the components (integrated circuits, screens, passive components) on a substrate that is compatible with existing technologies and then transfer them to their final substrates.

The interest of this approach is that it allows certain components to be made on low-cost substrates using technologies that are often simpler than the technologies used as standard in microelectronics. Examples of this are the technologies used to make flat screens, such as thin film transistors known under the acronym TFT, which are made from amorphous or polycrystalline silicon. These technologies involve the use of glass substrates as a rule.

Different techniques may be used to transfer layers from one substrate to another substrate. The techniques published in 1985 by T. Hamaguchi et al.—Proc. IEDM 1985 p. 688 are examples of these. These techniques are of particular interest because they provide an efficient way of transferring a layer from one substrate to another but the base substrate is necessarily consumed (destroyed during processing) and the thin film cannot be transferred homogeneously (i.e. with a constant thickness at every point) unless a barrier layer is used in order to prevent the substrate from being consumed.

More recently, other techniques for transferring TFT transistors (made from polysilicon on a glass substrate) onto plastic substrates have become known. Ref. S. Utsunomiya et al.—Proc. IDS 2000 p. 916 or patent EP 0 924 769 Al by Seiko. These methods are based on an approach according to which a separation layer (generally of amorphous silicon) is created on a substrate and, once the components have been made on this layer, they can then be separated and transferred to another substrate. In this case, the separation (or exfoliation) is effected using light irradiation (typically a laser-type beam). However, radiation of this type is difficult to control when working with large surfaces. In practice, if illumination is not homogeneous, it can lead to a non-homogeneous exfoliation, which can cause deterioration in the superficial film. This is a not inconsiderable technical handicap.

Of the various transfer methods, it is also possible to use methods of the type used to transfer thin layers of materials, which may or may not contain a microelectronic component, either in their entirety or a part of them. These methods are based on creating a fragile layer embedded in a material by introducing one or more gaseous species. Reference may be made to documents U.S. Pat. No. 5,374,564 (or FR-A-2681472 or EP-A-533551), U.S. Pat. No. 6,020,252 (or FR-A-2748851 or EP-A-807970), FR-A-2767416 (or EP-A-1010198), FR-A-2748850 (or EP-A-902843) or FR-A-2773261 (or EP-A-963598) which describe these methods.

These methods are generally used with a view to detaching the entire film from an initial substrate in order to transfer it to a substrate. The thin film obtained then contains some of the substrate. These films may be used as active layers for making electronic or optical components. In practical terms, the main advantage of these processes is that they enable thin films of monocrystalline substrates to be applied to different substrates. These films may contain a whole component or part of one.

With these processes, however, it is difficult to separate a thin layer from certain substrates, such as glass, silica glass, ceramics, certain polymers and certain amorphous materials, etc. To achieve the separation, it would be necessary to work under extreme experimental conditions: very high implant dose and/or high mechanical energy for separation purposes, etc. which barely seems feasible as things stand at present.

Glass is a substrate with a number of advantages. It is inexpensive, comes in large dimensions and is easy to manipulate. It is very widely used as a substrate for components such as active matrices and reading circuits for flat screens, color filters and even certain passive components (R, L, C).

A particular object of the invention is to take components made on this type of substrate and transfer them onto another substrate (for example plastic) or transfer them onto another substrate without having to create a fragile layer in the first substrate on which the components applied to it are picked up.

More generally, an object of the invention is to propose a method according to which components or devices made on a first substrate can be transferred to another substrate, without the drawbacks inherent in all the existing methods (consumption of the substrate, lack of homogeneity resulting from the transfer, specific properties of the substrate). In particular, an object of the invention is to be able to pick up components or devices made on a substrate which does not normally lend itself to producing an embedded layer that is weakened (the substrate can be recycled and reused once the film containing all or some of the components has been recovered) and to enable a very homogeneous transfer onto large dimensions (several tens of centimeters).

Presentation of the Invention

To this end, the invention proposes a method for producing a thin layer incorporating at least a part of a component, comprising:

a preparation step according to which an added layer is applied to a first substrate, at least a part of which is such that it can be locally weakened, this substrate and this part which can be weakened being made from different materials and/or having different microstructures, a weakening step according to which a fragile sub-layer is created in this part which can be weakened, a work step during which at least all or part of a component is made on this added layer, and a separation step according to which a separation is caused in this weakened part and along this fragile sub-layer so as to obtain a thin layer incorporating a part of this added layer and this component part.

Accordingly, the invention enables a thin layer incorporating a component to be separated from a substrate which can be freely selected according to various criteria relating to the preparation of this component, without having to make provision for effecting this separation in this substrate.

The invention applies more particularly to substrates which do not easily lend themselves to applications requiring a weakened layer to be provided with a view to subsequent separation. Consequently, the invention applies in particular to situations where the substrate is made from a semiconductor material or glass or silica glass (other materials also have the same drawback, especially ceramics, certain polymers and certain amorphous materials etc., see above), or substrates which enable separation but under conditions more difficult than those under which the detachable layer can be applied.

The invention applies more specifically to the situation where it is desirable to obtain a thin layer of large dimensions (which naturally means that the substrate must be of at least the same dimensions), in which case it is necessary in practical terms to use a substrate with good mechanical strength, in particular good rigidity.

The added layer may be of various types. For example, it may be made of silicon (preferred case), or even from germanium or an alloy of silicon and germanium. If this layer is made from silicon, it may be polycrystalline by preference, which is less expensive than monocrystalline silicon.

The part which can be weakened is advantageously made by deposition followed by recrystallisation. However, it may be made by other processes such as those described in patent specification U.S. Pat. No. 5,374,564.

This part which can be weakened is typically of the order of at least 50 manometers thick and is preferably less than about 1000 manometers: this helps to obtain good flatness in the bottom surface of the thin layer.

A priming layer may or may not be disposed between the substrate and the part which can be weakened. If the substrate is made from glass or silica glass and the part to be weakened is made from silicon, a priming layer of silicon oxide may optionally be applied.

According to another advantageous characteristic of the invention, the added layer has an additional layer on the part to be weakened, which receives the component (or at least part of it) and is identical or similar in nature (in terms of composition and mechanical, chemical properties, etc.) to that of the substrate. If this substrate is made from glass or silica glass, this additional layer is advantageously silicon oxide.

This additional layer may be added prior to or after the weakening step.

Accordingly, this characteristic of the invention involves making the weakened layer within a <<quasi-substrate>> (it is sandwiched between two identical or very similar materials); the latter has all the advantages offered by a substrate (for example: surface state, overall rigidity in the case of glass) whilst readily lending itself to the creation of a layer which is weakened by introducing gaseous species into the sandwiched layer. This <<quasi-substrate>> enables components or devices to be made on an incompatible substrate affording easy separation and then separating them without any problems, with a view to transferring them to another substrate.

The additional layer is preferably of the order of from 300 manometers to 10000 manometers thick, which is sufficiently thin to permit the weakening process but enough to be of significance to allow the component(s) or at least part of them to be made and/or to enable the thin layer to be rendered self-supporting and/or to avoid the occurrence of blistering during the steps involved in making these components, weakening or separation. In other words, this additional layer, located between the layer to be weakened and the components, may serve as a stiffener for the resultant thin layer. This also means that the thin layer can be manipulated before being placed on a final substrate, obviating the need for a temporary substrate.

This additional layer is preferably thicker than the layer to be weakened (for the reasons mentioned above in respect of the thickness of this layer to be weakened and the additional layer).

Advantageously, a third layer may be provided underneath the additional layer (between this additional layer and the layer to be weakened) which will ensure that the layer incorporating the components is compatible with the final substrate. This third layer may be a layer of Si3N4, for example. This being the case, after fracturing at the level of the weakened zone, the remaining part of the detachable layer is removed in order to release the layer of Si3N4.

The weakening step advantageously includes applying a thermally activatable treatment. More specifically, this treatment preferably includes introducing elements deep in the layer to be weakened, which can then bring about the desired weakening on diffusion.

Accordingly, by virtue of one advantageous characteristic of the invention, the weak zone is created by introducing gaseous species, preferably selected from hydrogen and/or helium and/or noble gases. The use of hydrogen is particularly appropriate; for more details, reference may be made to documents U.S. Pat. No. 5,374,564 (or FR-A-2681472 or EP-A-533551), U.S. Pat. No. 6,020,252 (or FR-A-2748851 or EP-A-807970), FR-A-2767416 (or EP-A-1010198), FR-A-2748850 (or EP-A-902843) or FR-A-2773261 (or EP-A-963598).

If opting for this type of thermally activatable treatment, the separation step preferably involves a specific input of thermal energy.

To be truly effective, this input preferably has the effect of raising at least the part to be weakened to a thermal budget in excess of the thermal budget already applied during the step when the components were manufactured.

The separation treatment may include an input of mechanical energy (in the broadest sense of the term, i.e. in the form of forces applied or constraints induced in the structure but also in pneumatic form, for example by an injection of gas, etc.) used in combination with the above-mentioned application of heat energy or alone.

In certain cases where several components or devices are made on a same substrate, it may be of advantage to produce a localized separation on a zone, the size of which corresponds to that of a device (or a whole number of devices).

By preference, object of the method proposed by the invention is to make an array of active or passive elements intended to contribute jointly to a same function; such an array is conventionally called a <<device>>. By way of example, a device may contain an optical, optoelectronic, electronic component, colored filters or a mechanical, chemical and/or biological sensor . . . It may also be a matrix with its address circuit (as in the case of a flat screen). A device therefore essentially consists of more than one component; and the components present within a layer are not necessarily identical.

Accordingly, a distinction may be made between several specific (but not exclusive) situations depending on whether the manufacturing step includes the manufacture:

of an optical or optoelectronic component, and/or an electronic component, and/or a mechanical, chemical or biological sensor.

One case of particular interest is that in which the manufacturing step includes at least the manufacture of at least one active matrix and its address circuit, designed to be integrated subsequently within a flat screen.

The method proposed by the invention may also include a covering step, after the work step, according to which a protective layer is deposited on the added layer incorporating the component. This protective layer is preferably made from silicon nitride, Si3N4, at least if the added layer is made from silicon and/or is an additional layer of silicon oxide. This protective layer may act as a means of ensuring compatibility with a final substrate (for example preventing the deterioration of components on a plastic substrate).

The transfer of all or part of the thin layer to a final substrate (or to several final substrates if the thin layer is not intended for a single final substrate) may or may not require the use of an intermediate substrate.

The method proposed by the invention may also include, before the separation step, a joining step according to which an intermediate substrate is affixed to the added layer (including the additional layer if one is provided) and, after the separation step, a step according to which this intermediate substrate is used to affix all or part of the thin layer to the final substrate(s).

During this joining step, the thin layer is preferably affixed to the intermediate substrate in a reversible manner and the thin layer is detached from the intermediate substrate after the transfer step. It is very easy to detach the detachable part of the thin layer from the intermediate substrate without the need for any specific treatment.

The final substrate is advantageously made from a different material than that used for the initial substrate. In particular, the final substrate may be a material that is incompatible with the thermal conditions which prevail during the work step or those during the separation step; this significantly broadens the choice available for this final substrate. Accordingly, it may advantageously be of a plastic material, for example transparent, the softening temperature of which may be lower than the maximum temperature of the work step (which is such that this substrate would not withstand this step); in practical terms, this is a situation of particular interest.

In this respect, the invention covers the specific application of the process involved in making flat screens.

It should be pointed out that the final substrate may be of different dimensions than the initial substrate and hence the resultant thin layer (bigger or smaller, depending on requirements).

Another case of particular interest is one where the final substrate is a chip card or a part of a mobile telephone, or even the plastic polarizer of a self-supporting flexible screen.

At this stage, it is important to note that if a plurality of components are provided on the added layer or additional layer during the work step, each component may be individually affixed to a specific final substrate, for example a chip card, having been detached from the rest of the thin layer (this comment also applies to the situation where the manufacturing step consists in making a plurality of batches of complementary components: each batch can be individually deposited).

An intermediate substrate of this type may be used to generate mechanical stresses at the level of the weakened layer in order to detach the thin layer from the substrate.

It should also be pointed out that the use of such an intermediate substrate for transferring to a final substrate separate from the initial substrate is not necessary in the case described above where an additional layer is thick enough to fulfill a stiffening function.

Another variant of the method proposed by the invention consists in incorporating a joining step, before the separation step, according to which the added layer (including the additional layer if one is provided) is affixed to a final substrate. In this case, the components will be disposed on this final substrate in a layout that is the inverse of the layout of these components on the added layer (the layout of components is maintained if the transfer is made via an intermediate substrate; and this layout may be maintained or inverted, as required, if the thin layer is self-supporting, i.e. if the additional layer acts as a stiffener.

Any means may be used to affix the component(s), with or without the rest of the thin layer, in particular bonding by means of an adhesive or alternatively by molecular adhesion.

Figure 6:
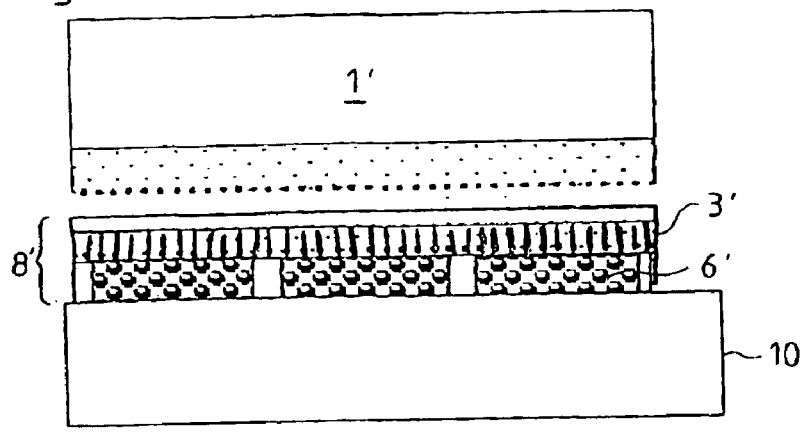
Figure 7:
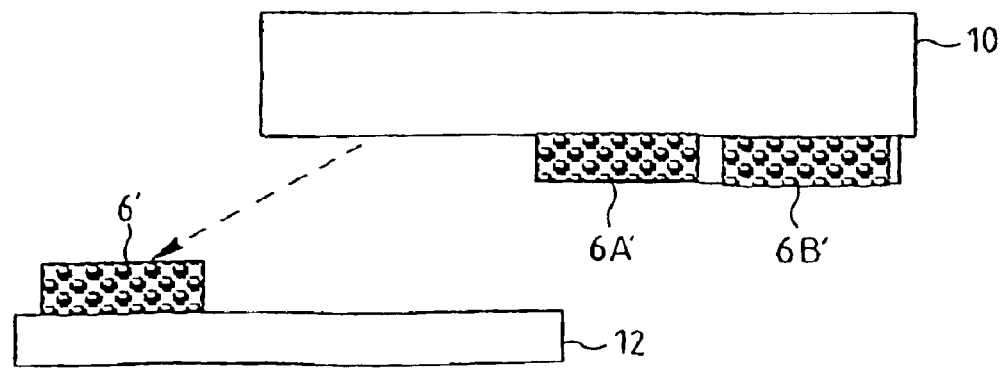
Figure 8:
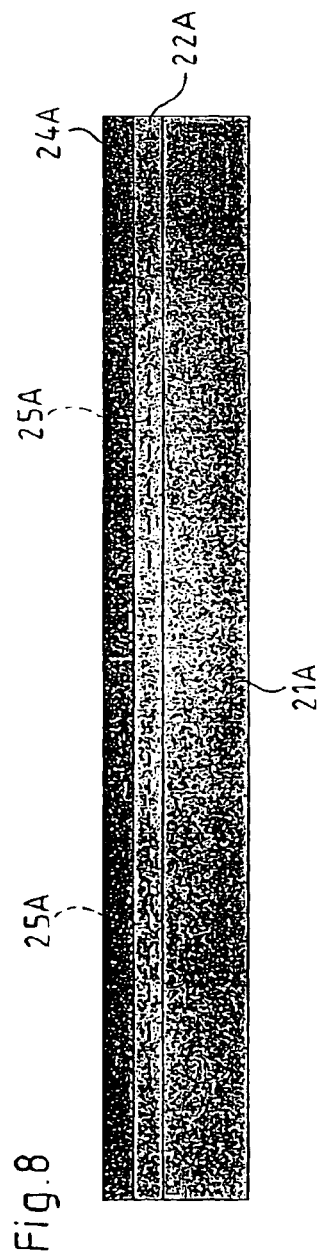
Figure 9:
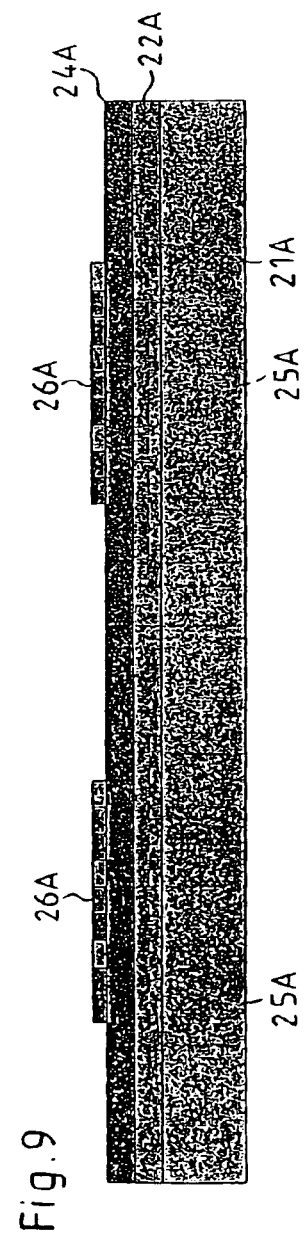
Figure 10:
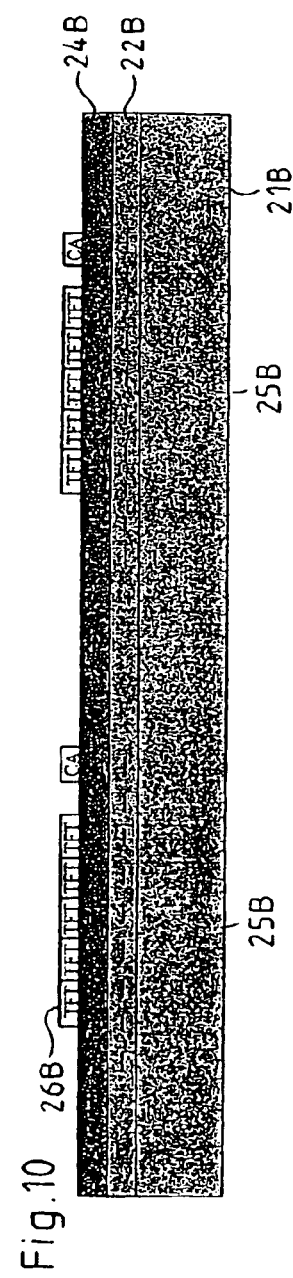
Figure 11:
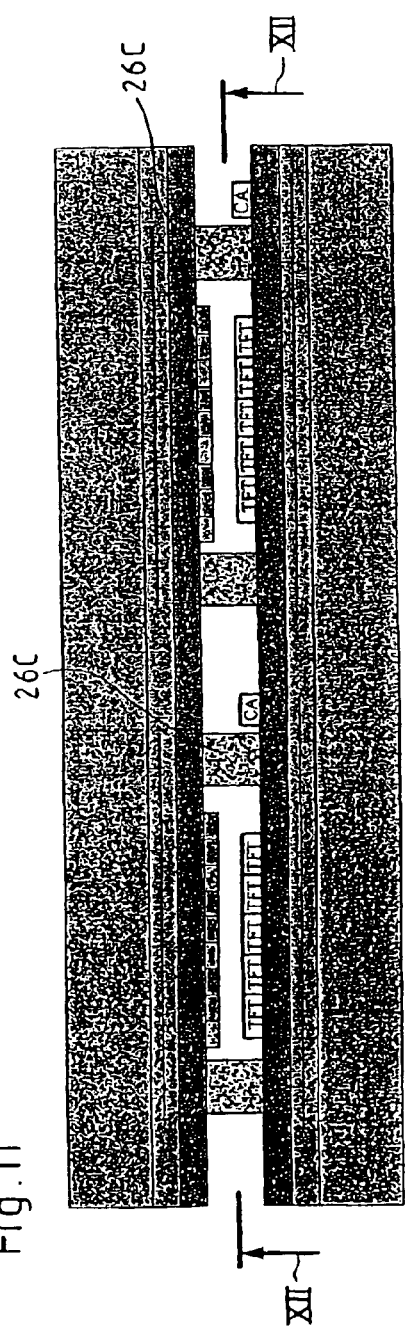
Figure 12:
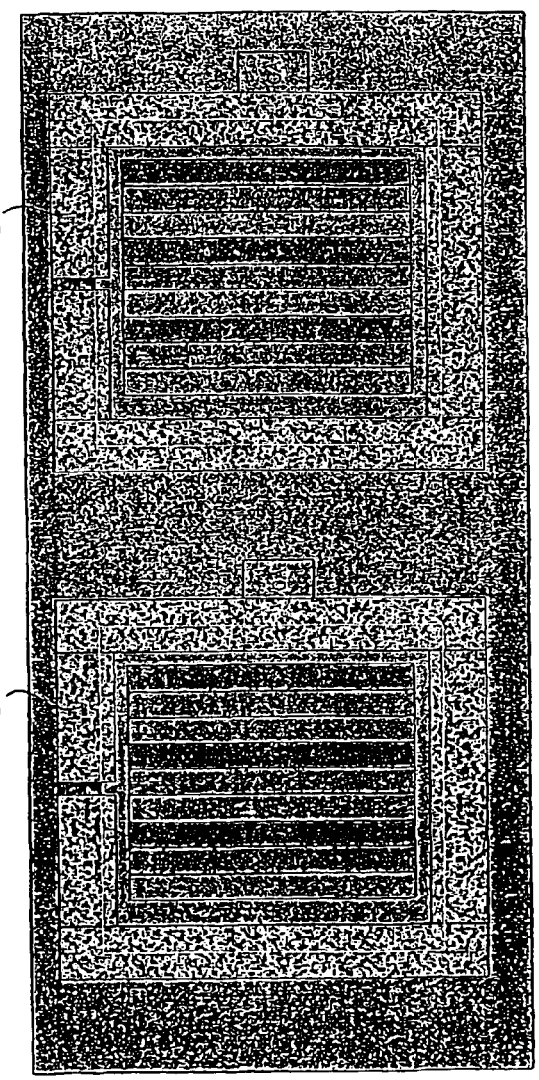
Figure 15:
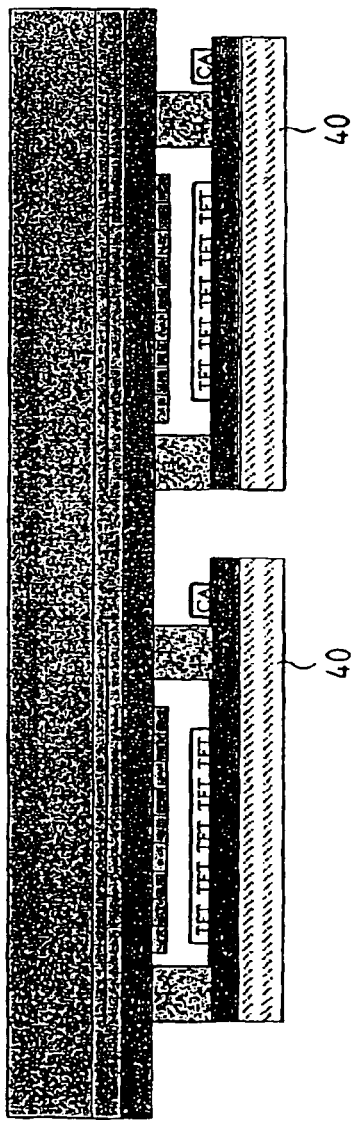
Figure 17:
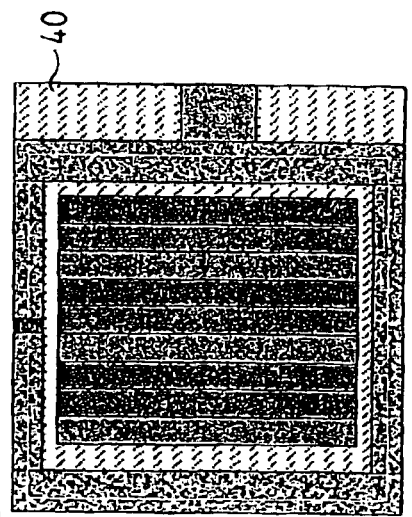
Figure 16:
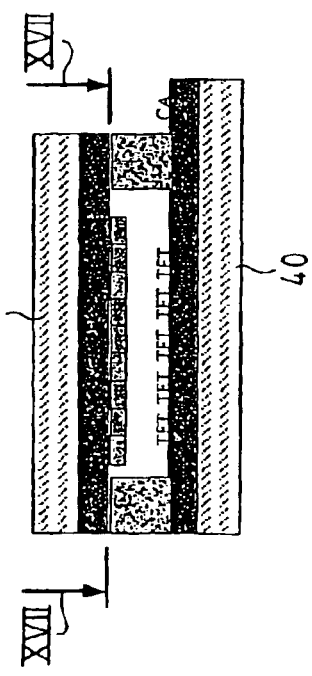

The objectives, characteristics and advantages of the invention will become clear from the description below, given by way of non-limitative illustrative example, with reference to the appended drawings, in which:

FIG. 1 is a schematic view in section of a substrate, on which a compatibility (priming) layer and then an added layer in two parts have been deposited during a preparatory step, FIG. 2 is a view of this substrate after a weakening step, FIG. 3 is a view of this substrate after a step during which components were manufactured, FIG. 4 is a view of this substrate after a detachment step, FIG. 5 is a view of a similar substrate after a step during which it was joined to a substrate, FIG. 6 is a view of this second substrate after a detachment step, FIG. 7 is a view of the thin layer resulting from the step illustrated in FIG. 6, after a partial transfer step FIG. 8 is a view in section of a pane of glass to which a layer has been transferred in two parts, FIG. 9 is a view of this pane after making components of a first type, FIG. 10 is a view of a pane similar to that illustrated in FIG. 8 after making components of a second type, FIG. 11 is a view of the two panes illustrated in FIGS. 9 and 10 after partial detachment and fixing in a head to tail configuration, FIG. 12 is a view in section along line XII—XII indicated in FIG. 11, FIG. 13 is a view illustrating a step during which the bottom pane is cut, FIG. 14 is a view in section along line XIV—XIV indicated in FIG. 13, FIG. 15 is an overall view after cutting as illustrated in FIGS. 13 and 14 and transferring to a plastic substrate, showing the contour of a step during which the top plate is cut, FIG. 16 is a view of a component after cutting and transfer to a second plastic substrate, and FIG. 17 is a view of this component in section.

FIGS. 1 to 4 provide general illustrations of an example of how the method proposed by the invention is implemented.

A pane of glass 1 of large dimensions, such as those used to manufacture LCD screens, for example, is the starting material. For example, it is a glass sold by the CORNING company under reference 1737.

A layer 2 of amorphous silicon is deposited in a thickness of 300 nm, for example, which is recrystallised by means of a laser beam to obtain polycrystalline silicon, also known as polysilicon. As will become clear below, this layer 2 can be weakened. Monocrystalline silicon can also be transferred but is not as interesting from an economic point of view.

In certain cases, before creating this layer specifically intended to permit detachment of a thin layer, an intermediate layer 3 may be deposited on the substrate to improve adhesion. This priming layer 3 might be a layer of silicon oxide, for example. The thickness of this layer is exaggerated in FIG. 1 to make it visible; this thickness may be barely 10 manometers.

The layer of polysilicon may also be obtained by CVD deposition at a temperature of 550° C., for example. This variant may be preferable to the one described above if the substrate is silica glass and if the substrate is capable of withstanding temperatures in the range of the deposition temperature. It should be pointed out that an expensive substrate may be used for the method proposed by the invention because in one embodiment this substrate can be recycled (is not consumed).

In the example illustrated, a layer 4 of silicon oxide a few hundred nanometers thick (for example 800 nm) is then deposited to return to a free surface of the SiO2 type close to that of the initial glass. Consequently, a quasi substrate 1+2+4 or 1 and 4 is obtained, made of very similar materal.

As illustrated in FIG. 2, a fragile sub-layer 5 is created in the layer 2. To this end, a treatment is applied which can then be thermally activated. By preference, ions or gaseous elements (they amount to the same thing, insofar as the lightest ions are ions of a gaseous element) are introduced at a depth in the polysilicon layer to create a layer which is weakened or will subsequently cause the detachment. For example, hydrogen is implanted in a dose of the order of 7E16H+/cm$^2$ and an energy of 100 keV.

These separation treatments will be adapted depending on the weakening steps (implantation dose, energy, implantation temperature etc.).

A silicon oxide layer of 3 micrometers thickness may be deposited (in the example described, therefore, this is tantamount to the thickness of the layer 4) to obtain a self-supporting structure after detachment. This layer will serve as a stiffener in the thin layer production process.

All or part of a device, i.e. at least one component 6 (there are three in FIG. 3, denoted by 6, 6A and 6B, which may jointly constitute a device) is then made on the SiO2 surface (see FIG. 3). This step is operated under conventional conditions, such as those which apply if working with a substrate made entirely of glass.

If the ultimate aim is to obtain a flat screen, the device may be made up of transistor units in the active matrix and its address circuit. As a rule, this technology does not require a temperature in excess of about 400° C.

A separation treatment (which is continued until detachment is achieved) is then applied to induce the transfer—see FIG. 4. As a rule, this step may include a heat treatment and/or a mechanical treatment. In certain cases, this separation may be initiated by a first means (for example heat) and then propagated to the detachment stage, for example by cleaving, by a second means (which may be mechanical, for example). In another variant, a heat treatment may be applied for several minutes at approximately 450° C., for example, in order to bring about the separation, followed by the detachment in the case where all the layers are capable of withstanding the heat treatment. The separation and detachment conditions will largely depend on the implantation conditions in a known manner.

The result is devices or components 6 which are separated from their manufacturing substrate 1+2. The thin layer which is thus obtained is denoted by reference 8. The spaces between the components may be occupied by a protective substance.

By separate is meant that the devices may still be in contact with the substrate but with a very low joining energy (held by electrostatic forces, for example). The term detachment is used in the sense of complete separation to the degree that the thin layer 8 is totally separate from its substrate.

As stated above, the additional layer 4 was dimensioned to enable it to act as a stiffener, which means that the thin layer is self-supporting and no additional stiffener is required in order to be able to manipulate it. The components may therefore be transferred to a final substrate (not illustrated).

Even though the thin layer may be said to be self-supporting, however, it may be preferable to adhere the device or the components 6 to an intermediate substrate, which will enable it or them to be manipulated more easily until the point at which it or they is or are placed on the final substrate. Any means may be used to obtain such adhesion, such as: the addition of a substance such as glue, for example, or means for applying surface preparations (molecular adhesion in particular).

Accordingly, FIG. 5 illustrates a substrate similar to that illustrated in FIG. 3, i.e. comprising a layer of glass 1', a layer 2' which can be weakened (optionally incorporating a priming layer 3') and an additional layer 4' on which the components 6', 6A' et 6B' are produced. A protective layer, not illustrated, has advantageously also been deposited. Before proceeding to detach the thin layer, the components are affixed to a substrate 10. After detachment (see FIG. 6), the substrate 10 makes it easier to manipulate the components.

Accordingly, FIG. 7 shows the substrate from which the component 6' has been transferred, individually, and placed on a final substrate 12, having been detached from the rest of the thin layer.

Another option might be one where it is desirable to place the components directly in contact with their final substrate. This being the case, the intention is that the components will remain on the substrate.

Naturally, it may be that the substrate 10 does not have the same composition or the same properties, depending on whether it will be used as a temporary substrate or the ultimate substrate.

If an intermediate substrate is used, adhesion can be controlled so that this adhesion is reversible. Consequently, once the device has been joined to its final substrate, the intermediate substrate can be removed.

It should be pointed out that a process of the type described in the prior art publications may be used, which means in particular that the bonding forces are controlled by controlling the surface roughness or hydrophilic properties.

After transferring the device to the final substrate, it may be finished by applying the relevant steps known from conventional technology operating and compatible with the final substrate.

In one variant of the method, once the device (6'+6A'+6B') has been made, it is detached by means of a heat treatment followed by the use of mechanical forces (applied by introducing a blade or introducing a liquid or gaseous fluid, etc., for example); the intermediate substrate 10 may help to generate forces within the fragile sub-layer, for example by applying torsional forces.

Such detachment can be obtained if the embedded fragile layer was produced by hydrogen implantation (6E16H+/cm2 at 100 keV). After making the device, at a temperature below 300° C. for example, a heat treatment is applied for 30 minutes at 450° C. to produce a high degree of weakening at the level of the fragile zone. Since this weakening gives rise to a thermally activated phenomenon, there is a specific time-temperature correlation for each implantation condition (energy, dose).

Finally, the detachment is completed by mechanical means.

In the examples described above, the layer to be weakened is silicon. In another variant, this layer to be weakened might also be germanium, SiGe or any other material which can be weakened by ion implantation (for example monocrystalline or polycrystalline semiconductor).

Consequently, the method proposed by the invention may be used as a means of transferring a device (made entirely on a first substrate) to a second, for example of the plastic type. Accordingly, an entire LCD screen can be made by conventional means and then finally transferred to a plastic substrate, which may advantageously be flexible.

FIGS. 8 to 17 illustrate the manufacture of a plurality of such individual LCD components.

In summary, this involves taking two panes of glass, which is the conventional approach to making flat screens: one pane on which the transistors of the active matrix and the address circuit will be made and one pane on which the color filters will be made. The two parts are assembled, the screen is finished, the glass substrate is removed and the screen transferred to the final substrate. In one variant of the method, the screen can be finished after being transferred to the final substrate.

FIG. 8 illustrates one, 21A, of the initial panes (the same treatment is applied to the other pane 21B). An added layer incorporating a layer to be weakened 22A (or 22B) is applied to each pane as well as a top layer 24A (or 24B) which will act as a stiffener.

This layer to be weakened is advantageously made from polycrystalline silicon (for example 200 nm). By preference, this layer may be even thinner (100 nm) in order to position the fracture in this very thin layer. A fragile zone is then created in this layer to permit subsequent detachment at the level of this zone.

In the particular case described here, where several devices have to be made on the same pane, it is of advantage to create fragile zones solely at the level of the future devices. Accordingly, the objective is to obtain a zone that will be separated from the substrate at the level of the components and held on the pane by the spaces between the devices (without a fragile zone). These fragile zones are denoted by references 25A and 25B on the first and second panes in FIGS. 8 (and 9) and 10 respectively.

The fragile zone is created by introducing a gaseous species, for example by implanting hydrogen and/or helium ions. If hydrogen ions are used, the dose may be selected from within a range of between $3E16 H+/cm^2$ and $1E17 H+/cm^2$. The fragile zone at the level of the future devices may be positioned by masking the zones that will not be implanted.

The layer 24A or 24B serving as a stiffener, for example an oxide layer, can not be deposited until after this implantation. Its purpose is to permit separation without giving rise to blistering. The conditions are such that the layer is self-supporting (see FR-A-2738671).

For example, a layer of silicon oxide can be deposited to a thickness of several microns, for example 5 microns, or even a thin layer of fine glass can be deposited (for example 30 microns).

Having been prepared as above, these panes are put through all the steps enabling the active matrix or color filter needed for the LCD component to be made. FIG. 9 shows the pane 21A on which the elements of the color filter 26A have been made, whilst FIG. 10 illustrates the pane 21B on which the elements of the active matrix 26B have been made (they are TFT transistors or Thin Film Transistors and an element CA (standing for address circuit)).

A treatment then follows to separate the thin layer, at the level of the locally implanted zone, from the substrate or pseudo-substrate with a part of its device. This treatment is a heat treatment, for example, operated at a temperature in the range of 450° C. to obtain a local separation or a very extensive weakening to enable subsequent separation using mechanical forces. In FIG. 11, the detachment zones are distinguished from the weakened zone shown in FIGS. 9 and 10 by the fact that they are shown as continuous lines.

These two panes along with their components are then assembled by a conventional method with the aid of a line of glue. Provided this glue is compatible with the conditions prevailing during detachment, the local detachment may take place after assembly.

FIG. 11 shows the two panes mounted head to tail with a cross-piece 26C surrounding both each group of transistors TFT and each color filter.

The conventional steps are then applied to obtain a LCD screen. i.e. filling with liquid crystal and sealing (see FIG. 12).

Then, as illustrated in FIGS. 13 and 14, the bottom pane is cut to the required dimensions, using the conventional diamond cutting technique (known as <<scribe and break>>). The glass substrate is then separated from the rest of the component because it is then cut vertically (as a result of the above-mentioned detachment) and laterally (by the cutting process described above). It may be necessary to apply mechanical force to obtain complete detachment at the level of the weakened zone.

Advantageously, all or part of the polycrystalline silicon layer may be removed before the transfer to the final substrate. In the example illustrated in FIG. 15, the residual part of the polycrystalline silicon has been removed in its entirety before gluing the component onto the final substrate, in this case a plastic substrate 40. The plastic substrate may advantageously be the polarizer. Its thickness may be chosen to suit the intended application.

The cutting operation is then repeated on the top pane (FIG. 15) to finally obtain (see FIGS. 16 and 17) a LCD screen between two polarizers 40 and 41 in the presence of the glass used to make it.

What is claimed is:

1. A method for producing a thin layer incorporating at least one component or component part comprising:
   preparation steps comprising forming first and second added layers on first and second substrates respectively, wherein at least a part of each added layer can be locally weakened, wherein each of the first and second substrates and an associated part of the added layer to be weakened comprise different materials or different microstructures or both different materals and microstructures,
   weakening steps wherein in each of the first and second added layers a fragile sub-layer is created in each part to be weakened,
   work steps wherein complementary parts of the component or the component part are made on the first and second added layers,
   a joining step wherein the first and second substrates are assembled head to tail with the complementary parts of the component facing one another, and
   a separation step, a portion of which may take place between the weakening steps and the joining step, wherein a detachment is induced in the weakened parts along the fragile sub-layers, ultimately to obtain a thin layer incorporating at least the component or the component part.

2. A method according to claim 1, wherein during the preparation steps, a plurality of components or component parts are made and, during the weakening steps, the fragile sub-layer is created facing the future components only and, during the separation step, the components or component parts are individually detached.

3. A method according to claim 2, wherein the separation steps include, prior to the joining step, a step according to which the fragile sub-layers are converted into detachment zones.

4. A method according to claim 2, wherein the components or component parts are detached individually by cutting one of the substrates transversely to the thin layer.

5. A method according to claim 1, wherein a plurality of components or component parts are made during the work steps and, during the separation step, each component or part component is individually affixed to a final substrate, having been detached from the rest of the thin layer.

6. A method according to claim 5, wherein the final substrate comprises a different material than that of the initial substrate.

7. A method according to claim 6, wherein the final substrate comprises a plastic material.

8. A method according to claim 7, wherein the final substrate comprises a transparent plastic material.

9. A method according to claim 7, wherein the final substrate has a softening temperature below the maximum temperature of the work step.

10. A method according to claim 5, wherein the final substrate comprises a material that is incompatible with the thermal conditions prevailing during the work step or those of the separation step.

11. A method according to claim 5, wherein the final substrate comprises a chip card.

12. A method according to claim 1, wherein at least a part of the thin layer is affixed to a final substrate by gluing or molecular adhesion.

13. A method according to claim 1, wherein at least one of the substrates comprises one of a semiconductor material, glass, or silica glass.

14. A method according to claim 1, wherein at least one of the substrates comprises an amorphous material.

15. A method according to claim 1, wherein the part to be weakened in the detachable layer comprises at least one material selected from the group consisting of silicon, germanium, and their alloys.

16. A method according to claim 15, wherein the part to be weakened in each added layer comprises silicon.

17. A method according to claim 16, wherein the part to be weakened comprises polycrystalline silicon.

18. A method according to claim 1, wherein the part to be weakened is made by deposition followed by recrystallisation.

19. A method according to claim l, wherein the part to be weakened has a thickness of the order of from 50 manometers to 1000 manometers.

20. A method claim 1, wherein the added layer has a sub-layer serving as a primer between the part to be weakened and the substrate.

21. A method according to claim 20, wherein the substrate comprises glass or silica glass, the part to be weakened comprises silicon and wherein the sub-layer is comprises silicon oxide.

22. A method according to claim 1, wherein on the part to be weakened, the added layer has an additional layer having a composition to identical or similar to that of the substrate.

23. A method according to claim 22, wherein the substrate is made from glass or silica glass and the additional layer comprises silicon oxide.

24. A method according to claim 22, wherein the additional layer has a thickness of the order of from 300 manometers to 10000 manometers.

25. A method according to claim 22, wherein the additional layer has a thickness which is thicker than that of the sub-layer to be weakened.

26. A method according to claim 1, wherein the weakening steps include applying a thermally activatable treatment.

27. A method according to claim 26, characterized in that wherein the weakening steps comprise introducing at least one gaseous species, selected from the group consisting of hydrogen, helium, and the noble gases, at a depth in the part to be weakened.

28. A method according to claim 27, wherein the weakening steps comprise introducing hydrogen at a depth in the part to be weakened.

29. A method according to claim 1, wherein the separation step comprises applying thermal energy.

30. A method according to claim 29, wherein an effect of applying thermal energy to raise at least the part to be weakened to a thermal budget in excess of the thermal budget already applied.

31. A method according to claim 1, wherein the separation step comprise applying mechanical energy.

32. A method according to claim 1, wherein the work steps comprises manufacturing an optical or optoelectronic component or a color filter.

33. A method according to claim 1, wherein the work steps comprises manufacturing an electronic component.

34. A method according to claim 1, wherein the work steps comprises manufacturing one of a mechanical, chemical or biological sensor.

35. A method according to claim 1, wherein the work steps comprises manufacturing at least one active matrix and an associated address circuit, adapted to be integrated within a flat screen.

36. A method according to claim 1, wherein after the work steps, the method further comprises a covering step according to which a protective layer is deposited on the added layer incorporating the component or component part.

37. A method according to claim 36, wherein the protective layer comprises $Si_3N_4$.

38. The method according to claim 1 wherein the method comprises the manufacture of flat screens.

* * * * *

UNITED STATES PATENT AND TRADEMARK OFFICE
CERTIFICATE OF CORRECTION

PATENT NO.       : 6,939,782 B2
APPLICATION NO.  : 10/469633
DATED            : September 6, 2005
INVENTOR(S)      : Bernard Aspar et al.

It is certified that error appears in the above-identified patent and that said Letters Patent is hereby corrected as shown below:

Column 12, in claim 27, line 1, after "according to claim 26," delete "characterized".

Signed and Sealed this

Fifth Day of December, 2006

JON W. DUDAS
*Director of the United States Patent and Trademark Office*